June 8, 1965 M. P. XYLANDER 3,188,494
READ-OUT DRIVER AND LEVEL SETTER CIRCUIT
Filed Feb. 6, 1963
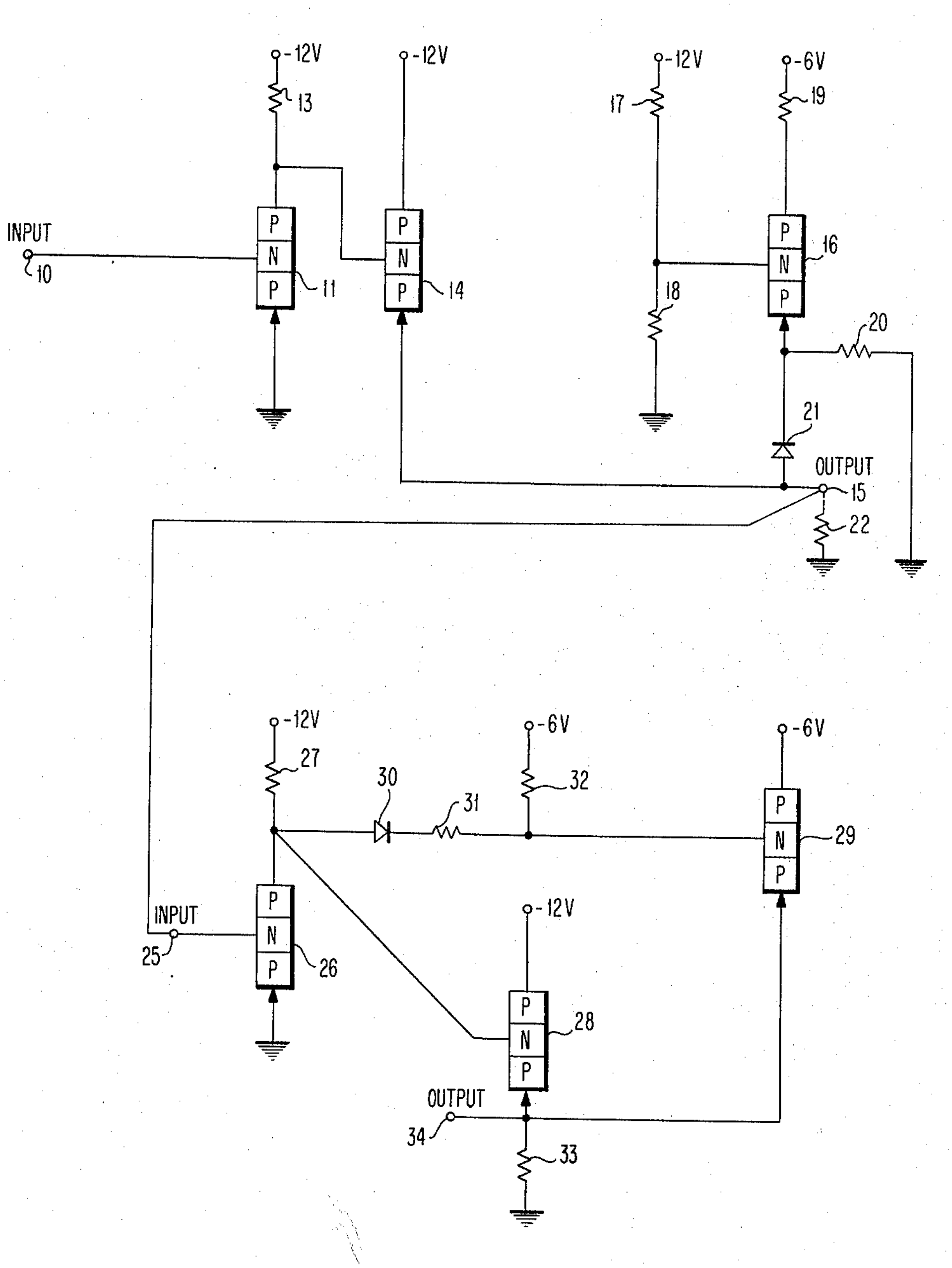
INVENTOR
MELVIN P. XYLANDER
BY [signature]
AGENT

United States Patent Office 3,188,494

Patented June 8, 1965

3,188,494

READ-OUT DRIVER AND LEVEL SETTER CIRCUIT

Melvin P. Xylander, Apalachin, N.Y., assignor to International Business Machines Corporation, New York, N.Y., a corporation of New York Filed Feb. 6, 1963, Ser. No. 256,690
8 Claims. (Cl. 307—88.5)

This invention relates to logical circuits and more particularly to read-out driver and level setting circuitry to facilitate the transfer of information from one storage medium to another within a computer system.

In computer systems utilizing semiconductor devices, the logical circuitry used for accomplishing data transfer functions exhibits relatively high current and high power dissipation requirements. "NPN" type of logic was found to be economically unsatisfactory and presently there are few "PNP" transistors with high frequency response and adequate power dissipating characteristics. One solution to the problem is a "brute" force method using more transistors but this method has other undesirable characteristics. The present invention provides a way to overcome the power dissipation problems while maintaining nominal output signal levels, and at a minimum of cost.

Accordingly, it is the principal object of this invention to provide logical circuitry having high power dissipation at low power levels and high current with constant voltage output characteristics.

There is another object of this invention to provide an improved read-out driver and level setter circuit.

A still further object of this invention is to provide a circuit that will drive high current constant voltage signals.

A further object of this invention is to provide high speed logical circuitry consisting principally of semiconductive components.

Briefly, this invention comprises a read-out driver circuit having a power inverter and two emitter follower stages with the output thereof coupled to a low power level setter circuit having a power inverter and two emitter follower stages.

The foregoing and other objects, features and advantages of the invention will be apparent from the following more particular description of a preferred embodiment of the invention, as illustrated in the accompanying drawings.

In the drawings, the single figure is a preferred embodiment of a readout driver and voltage level setter circuit.

Referring now to the drawing, the first stage is a logical circuit for a read-out driver. The input terminal 10 is coupled to the base of a PNP type transistor 11. The emitter of transistor 11 is grounded and the collector is coupled to a −12 v. supply through resistor 13. The collector of transistor 11 is also coupled to the base of a PNP base drift transistor 14. The transistor 14, which is connected in an emitter follower configuration, has its collector coupled to a −12 v. supply and its emitter coupled to the output terminal 15. The type choice for transistor 14 is a compromise of speed and power dissipation.

The emitter follower comprising the type PNP transistor 16 has its base coupled to the voltage divider arrangement of resistors 17 and 18, its collector coupled to a −6 v. through resistor 19, its emitter coupled to ground through resistor 20 and to output terminal 15 through diode 21. The choice of a PNP type for transistor 16 is based on speed because of the lower current and power considerations as compared to the characteristics required for transistor 14. Resistor 19 serves to reduce the power dissipation for transistor 16. Resistor 22 serves as a load resistance.

In operation, transistor 11 is normally non-conducting and transistor 14 will be conducting establishing the output terminal 15 at approximately −12 v. When a negative input signal is applied to the input terminal 10, transistor 11 will become conducting and transistor 14 will be rendered non-conducting with the diode 21 serving to clamp the voltage of the output terminal 15 at approximately −4 v. The output terminal 15 may be conveniently coupled to input terminal 25 to provide for nominal voltage level setting.

In the preferred embodiment the nominal output levels are −12 v. to −4 v. An emitter follower configuration was chosen to establish the −12 v. level because there is no voltage more negative than −12 v., and it is non-saturating and, therefore, much faster than a common emitter configuation. The −4 v. level is established by using another emitter follower to generate this −4 v. level and then clamping the output to this level with a diode 21. The resistor 20 serves as a load when the diode 21 is reversed biased. Thus, the transistor 16 is never in a reverse biased state. The diode 21 absorbs the complete reverse bias. Thus, preventing the base emitter junction of the transistor 16 from having to absorb the full reverse bias voltage.

The second stage is a preferred embodiment for a low power level setter wherein the input terminal 25 is coupled to the base of a PNP type transistor 26. The emitter of transistor 26 is grounded and the collector is coupled to a −12 v. supply through the resistor 27. The collector of transistor 26 is also coupled to the base of a PNP type transistor 28 and to the base of another type PNP transistor 29 through the diode 30 and resistor 31. The base of transistor 29 is also coupled to a −6 v. supply through resistor 32. The collector of transistor 29 is coupled directly with a −6 v. supply and the collector of transistor 28 is coupled directly with a −12 v. supply. The emitters of transistors 28 and 29 are coupled to ground through the resistor 33 and with the output terminal 34.

When transistor 26 is in its non-conducting state, the base of transistor 28 is approximately −12 v. Since transistor 28 is coupled in an emitter follower configuration, the emitter will also be approximately −12 v. The base of transistor 29 can never go more negative than −6 v., and therefore, transistor 29 is reverse biased. Diode 30 is likewise reverse biased under this condition. This is necessary in order to prevent the base-collector junction of transistor 29 from clamping the base of transistor 28 at −6 v. When transistor 26 goes into its saturated conducting state, the voltage divider arrangement comprising resistors 31 and 32 put the base of transistor 29 at approximately −4 v. Since transistor 29 is an emitter follower, the emitter also be approximately −4 v. Since the emitters of transistors 28 and 29 are commonly connected, transistor 28 will be reverse biased.

The power dissipation of transistor 28 when the output at terminal 34 was at −12 v. was very low because the voltage across the transistor 28 is very small. The power dissipation of transistor 29 when the output at terminal 34 was at −4 v. was likewise small because the voltage across the transistor 28 was only about 2 v. If a normal emitter follower configuration had been used, the power dissipation would have been relatively much greater. The circuit herein disclosed does not merely redistribute power, but actually reduces the power.

The read-out driver and level setter circuits herein disclosed may be used wherever two high current, constant voltage levels are required. It is particularly useful in special strobe circuits or level setters, or other special circuits, such as read-out drivers for a tunnel diode register.

While the invention has been particularly shown and described with reference to a preferred embodiment thereof, it will be understood by those skilled in the art that various changes in form and details may be made therein without departing from the spirit and scope of the invention.

What is claimed is:

1. A read-out driver and lever setter circuit comprising in combination:

(a) a read-out driver stage including a plurality of transistors each having a base, emitter, and collector with a first transistor connected in inverter configuration and a pair of transistors connected in emitter follower configuration with an asymmetric current conducting means coupled between the emitters of the transistors connected in emitter follower configuration, (b) means for applying an input signal to the base of said first transistor, (c) means for deriving a signal from the collector of said first transistor and applying said signal to the base of transistor in the first emitter follower configuration whereby the signal serves to control the conductivity in the first emitter follower transistor which, in turn, controls the amount of conductivity in the second emitter follower transistor with the emitter follower configurations and the asymmetric current conducting means serving to provide output signals having predetermined voltage levels, (d) a voltage level setting stage including a plurality of transistors each having a base, emitter, and collector with one transistor connected in inverter configuration and a pair of transistors connected in emitter follower configuration, (e) means for applying the output signal of the read-out driver stage to the base of the first transistor in the voltage level setting stage, (f) means for deriving a signal from the collector of said first transistor in the voltage level setting stage and applying said signal to the bases of the transistors in the emitter follower stages of the voltage level setting stage for reversibly changing the state of conduction in the two emitter follower stages to produce output signals in the emitters having predetermined voltage level characteristics and adapted for deliverance to utilization means.

2. A read-out driver and lever setter circuit comprising in combination:

(a) a read-out driver stage including a plurality of PNP type transistors each having a base, emitter, and collector with a first transistor connected in inverter configuration and a pair of transistors connected in emitter follower configuration with an asymmetric current conducting means coupled between the emitters of the transistors connected in emitter follower configuration, (b) means for applying an input signal to the base of said first transistor, (c) means for deriving a signal from the collector of said first transistor and applying said signal to the base of transistor in the first emitter follower configuration whereby the signal serves to control the conductivity in the first emitter follower transistor which, in turn, controls the amount of conductivity in the second emitter follower transistor with the emitter follower configurations and the asymmetric current conducting means serving to provide output signals having predetermined voltage levels, (d) a voltage level setting stage including a plurality of PNP type transistors each having a base, emitter, and collector with one transistor connected in inverter configuration and a pair of transistors connected in emitter follower configuration, (e) means for applying the output signal of the read-out driver stage to the base of the first transistor in the voltage level setting stage, (f) means for deriving a signal from the collector of said first transistor in the voltage level setting stage and applying said signal to the bases of the transistors in the emitter follower stages of the voltage level setting stage for reversibly changing the state of conduction in the two emitter follower stages to produce output signals in the emitters having predetermined voltage level characteristics adapted for deliverance to utilization means.

3. A read-out driver and lever setter circuit for supplying high current constant voltage level pulses to a load comprising:

(a) a first transistor having a base, emitter, and collector and connected in inverter configuration, (b) a second transistor having a base, emitter, and collector and connected in emitter follower configuration, (c) a third transistor having a base, emitter, and collector and connected in emitter follower configuration, (d) asymmetric current conducting means connected between the emitters of said second and third transistors and functioning to clamp the output signal at a predetermined voltage level, (e) means coupling the collector of said first transistor with the base of said second transistor, (f) a fourth transistor having a base, emitter, and collector and connected in inverter configuration, (g) a fifth transistor having a base, emitter, and collector and connected in emitter follower configuration, (h) a sixth transistor having a base, emitter, and collector and connected in emitter follower configuration, (h1) voltage supply means appropriately connected with the collectors of each of the transistors, (h2) means coupling the collector of said fourth transistor with the base of said sixth transistor, (h3) asymmetric current conducting means coupled between the collector of said fourth transistor and the base of said fifth transistor, (i) means for applying an input signal to the base of said first transistor to cause conductivity transitions in the circuitry, (i1) means for deriving a signal from the emitter of said second and third transistors and applying said signal to the base of said fourth transistor, (j) means for deriving a signal from the emitters of said fifth and sixth transistors having high current, constant voltage characteristics which is adaptable for deliverance to other utilization means.

4. A read-out driver and level setter circuit for supplying high current constant voltage level pulses to a load comprising:

(a) a first transistor of the PNP type having a base, emitter, and collector and connected in inverter configuration, (b) a second transistor of the PNP type having a base, emitter, and collector and connected in emitter follower configuration, (c) a third transistor of the PNP type having a base, emitter, and collector and connected in emitter follower configuration, (d) asymmetric current conducting means connected between the emitters of said second and third transistors and functioning to clamp the output signal at a predetermined voltage level, (e) voltage biasing means coupled with the base of said third transistor, (f) a fourth transistor of the PNP type having a base, emitter, and collector and connected in inverter configuration, (g) a fifth transistor of the PNP type having a base, emitter, and collector and connected in emitter follower configuration, (h) a sixth transistor of the PNP type having a base, emitter, and collector and connected in emitter follower configuration, (h1) voltage supply means connected with the collectors of each of the transistors, (i) means for applying an input signal to the base of said first transistor, (j) means for deriving a signal from the collector of said first transistor and applying said signal to the base of said second transistor, (k) means for deriving a signal from the emitter of said second and third transistors and applying said signal to the base of said fourth transistor, (l) means coupling the collector of said fourth transistor with the bases of said fifth and sixth transistors, (m) means for deriving a signal from the emitters of said fifth and sixth transistors having high current, constant voltage characteristics which is adaptable for deliverance to other utilization means.

5. A read-out driver and level setter circuit for supplying high current constant voltage level pulses to a load comprising:

(a) a first transistor of the PNP type having a base, emitter, and collector and connected in inverter configuration, (b) a second transistor of the PNP type having a base, emitter, and collector and connected in emitter follower configuration, (c) a third transistor of the PNP type having a base, emitter, and collector and connected in emitter follower configuration, (d) a biasing means for said third transistor, (e) diode means connected between the emitters of said second and third transistors and functioning to clamp the output signal at a predetermined voltage level, (f) means coupling the collector of said first transistor with the base of said second transistor, (g) a fourth transistor of the PNP type having a base, emitter, and collector and connected in inverter configuration, (h) a fifth transistor of the PNP type having a base, emitter, and collector and connected in emitter follower configuration, (i) a sixth transistor of the PNP type having a base, emitter, and collector and connected in emitter follower configuration, (j) a biasing means for said sixth transistor, (k) means for applying an input signal to the base of said first transistor, (l) means for deriving a signal from the collector of said first transistor and applying said signal to the base of said second transistor, (m) means for deriving a signal from the emitter of said second and third transistors and applying said signal to the base of said fourth transistor, (n) means coupling the collector of said fourth transistor with the base of said fifth transistor and said biasing means coupled with the base of said sixth transistor, (o) means for deriving a signal from the emitters of said fifth and sixth transistors having high current, constant voltage characteristics which is adaptable for deliverance to other utilization means.

6. A read-out driver and level setter circuit for supplying a high current constant voltage level pulses to a load regardless of the impedance variations of the load comprising:

(a) a first PNP transistor having a base, emitter, and collector and connected in inverter configuration, (b) second and third PNP transistors each having a base, emitter, and collector and connected in emitter follower configuration, (c) a voltage biasing arrangement coupled with the base of said third transistor, (d) unidirectional current conducting means connected between the emitters of said second and third transistors and functioning to clamp the output signal of the emitter followers of the second and third transistors at a predetermined voltage level, (e) a fourth PNP transistor having a base, emitter, and collector and connected in inverter configuration, (f) fifth and sixth PNP transistors each having a base, emitter, and collector and connected in emitter follower configuration, (g) a voltage divider and unidirectional current conducting device arrangement associated with the base of said sixth transistor for biasing said sixth transistor into non-conduction when said fifth transistor is conducting thereby establishing a voltage level of the output signal, (h) means for applying an input signal to the base of said first transistor, (h1) means for deriving a signal from the collector of said first transistor applying said signal to the base of said second transistor, (i) means for deriving a signal from the collector of said first transistor and applying said signal to the base of said second transistor, (j) means for deriving a signal from the emitter of said second and third transistors and applying said signal to the base of said fourth transistor, (k) means coupling the collector of said fourth transistor with the base of said fifth transistor and said biasing means coupled with the base of said sixth transistor, (l) means for deriving a signal from the emitters of said fifth and sixth transistors having high current, constant voltage characteristics which is adaptable for deliverance to other utilization means.

7. A read-out driver and level setter circuit for supplying a high current constant voltage level pulses to a load regardless of the impedance variations of the load comprising:

(a) a first PNP transistor having a base, emitter, and collector and connected in inverter configuration and normally in a non-conducting state, (b) second and third PNP transistors each having a base, emitter, and collector and connected in emitter follower configuration, (c) a first voltage supply of negative polarity, (d) a voltage divider circuit arrangement coupled with said first voltage supply and the base of said third transistor to provide biasing means for said third transistor, (e) diode means connected between the emitters of said second and third transistors and functioning to clamp the output signal of the emitter followers of the second and third transistors at a predetermined voltage level, (f) a fourth PNP transistor having a base, emitter, and collector and connected in inverter configuration normally in a conducting state, (g) fifth and sixth PNP transistors each having a base, emitter, and collector and connected in emitter follower configuration, (h) a second voltage supply of negative polarity, (i) a voltage divider and unidirectional current conducting device arrangement connected with said second voltage supply and with the collector of said fourth transistor and with the base of said sixth transistor for controllably biasing said sixth transistor into nonconduction when said fifth transistor is conducting thereby establishing a voltage level of the output signal, (i1) means for deriving a signal from the collector of said first transistor and applying said signal to the base of said second transistor, (i2) means for deriving a signal from the emitter of said second and third transistors and applying said signal to the base of said fourth transistor, (j) means for applying an input signal to the base of said first transistor rendering it conductive which in turn renders said second transistor non-conductive and increases the conductivity in said third transistor, the output signal from the emitter follower stages comprising said second and third transistors serving to render said fourth transistor non-conductive which in turn causes said fifth transistor to become conductive and said sixth transistor non-conductive, the conductivity transitions and circuitry functioning to provide an output signal of high current, constant voltage characteristics adapted for deliverance to a utilization device.

8. A read-out driver and level setter circuit for supplying high current constant voltage level pulses to a load regardless of the impedance variations of the load comprising:

(a) a first PNP transistor having a base, emitter, and collector and connected in inverter configuration and normally in a non-conducting state, (b) second and third PNP transistors each having a base, emitter, and collector and connected in emitter follower configuration with said second transistor being normally conductive, (c) a first voltage supply of negative polarity, (d) a voltage divider circuit arrangement coupled with said first voltage supply and the base of said third transistor to provide biasing means for said third transistor, (e) diode means connected between the emitters of said second and third transistors and functioning to clamp the output signal of the emitter followers of the second and third transistors at a predetermined voltage level, (f) a fourth PNP transistor having a base, emitter, and collector and connected in inverter configuration normally in a conducting state, (g) fifth and sixth PNP transistors each having a base, emitter, and collector and connected in emitter follower configuration, (h) a second voltage supply of negative polarity, (i) a voltage divider arrangement connected with said second voltage supply and with the base of said sixth transistor for biasing said sixth transistor into non-conduction when said fifth transistor is conducting thereby establishing a voltage level of the output signal, (i1) means for deriving a signal from the collector of said first transistor and applying said signal to the base of said second transistor, (i2) means for deriving a signal from the emitter of said second and third transistors and applying said signal to the base of said fourth transistor, (i3) means coupling the collector of said fourth transistor with the base of said fifth transistor and said biasing means coupled with the base of said sixth transistor, (j) means for applying an input signal to the base of said first transistor rendering it conductive which in turn renders said second transistor non-conductive and increases the conductivity in said third transistor, the output signal from the emitter follower stages comprising said second and third transistors serving to render said fourth transistor non-conductive which in turn causes said fifth transistor to become conductive and said sixth transistor non-conductive, the conductivity transitions and circuitry functioning to provide an output signal of high current, constant voltage characteristics adapted for deliverance to a utilization device.

References Cited by the Examiner

UNITED STATES PATENTS 3,058,008 10/62 Clapper ---------- 307—88.5

ARTHUR GAUSS, *Primary Examiner.*